United States Patent [19]
Bremer et al.

[11] Patent Number: 5,559,791
[45] Date of Patent: *Sep. 24, 1996

[54] COMPANDING OF VOICE SIGNAL FOR SIMULTANEOUS VOICE AND DATA TRANSMISSION

[75] Inventors: Gordon Bremer; Kenneth D. Ko, both of Clearwater; Luke J. Smithwick, New Port Richey, all of Fla.

[73] Assignee: Lucent Technologies Inc., Murray Hill, N.J.

[*] Notice: The term of this patent shall not extend beyond the expiration date of Pat. No. 5,448,555.

[21] Appl. No.: 76,506

[22] Filed: Jun. 14, 1993

[51] Int. Cl.⁶ .................................... H04J 11/00
[52] U.S. Cl. .................................... 370/20
[58] Field of Search ........................ 395/2.1, 2

[56] References Cited

U.S. PATENT DOCUMENTS

| | | | |
|---|---|---|---|
| 4,123,711 | 10/1978 | Chow | 325/62 |
| 4,512,013 | 4/1985 | Nash et al. | 370/69.1 |
| 4,523,311 | 6/1985 | Lee et al. | 370/69.1 |
| 4,546,212 | 10/1985 | Crowder | 179/2 C |
| 4,648,089 | 3/1987 | Hsing | 370/62 |
| 4,672,602 | 6/1987 | Hargrave et al. | 370/58 |
| 4,757,495 | 7/1988 | Decker et al. | 370/76 |
| 4,924,516 | 5/1990 | Bremer et al. | 380/46 |
| 5,081,647 | 1/1992 | Bremer | 375/5 |
| 5,103,227 | 4/1992 | Betts | 341/61 |
| 5,105,443 | 4/1992 | Betts et al. | 375/265 |
| 5,150,381 | 9/1992 | Forney, Jr. et al. | 375/261 |
| 5,164,980 | 11/1992 | Bush et al. | 348/17 |
| 5,448,555 | 9/1995 | Bremer et al. | 370/20 |
| 5,473,279 | 12/1995 | D'Angelo et al. | 327/347 |

FOREIGN PATENT DOCUMENTS 0229923  7/1987  European Pat. Off. ........ H04L 27/02

OTHER PUBLICATIONS

T. L. Lim, et al "Adaptive Equalization & Phase Tracking for Simultaneous Analog/Digital Data Transmission", Bell System Tech. Journal, vol 60, No.9, Nov. 1981, pp. 2039–2063.
"Picture Transmission Equipment", Patent Abstracts of Japan, Publication No. JP63054052, publication date Aug. 3, 1988, Horiike Yoshio, Int. Class: H04L27/34; H03G7/00. Listed as particularly relevant if taken alone in European Search Report regarding EPO Application EP 94 30 4183.
"Companded PCM Weighted QAM Transmission with the Erasure Zone", Publication No. 8, Publication date Aug., 1992, S. C. Ahn et al, vol. E75–B, pp. 733–738. Listed as technological background in European Search Report regarding EPO Application No. 94 30 4183.
European Search Report dated Sep. 22, 1984, regarding EPO Application No. 94 30 4183.
"Adaptive Equalization and Phase Tracking for Simultaneous Analog/Digital Data Transmission" by T. L. Lim and M. S. Mueller, The Bell System Technical Journal, vol. 60, No. 9, Nov. 1981, pp. 2039–2063, U.S.A.

(List continued on next page.)

*Primary Examiner*—Allen R. MacDonald
*Assistant Examiner*—Thomas J. Onka
*Attorney, Agent, or Firm*—Joseph J. Opalach

[57] ABSTRACT

In a simultaneous voice and data communications system, a voice signal is added to a data signal before transmission over the public switched telephone network (PSTN). In particular, in every signaling interval, a signal point is selected for transmission as a function of both the voice signal and the data signal. Since the voice signal is effectively offset by the data signal, compandors normally found in the PSTN are not effective in improving the signal to noise ratio of the transmitted voice and data signal. Therefore, the voice signal is additionally companded in the transmitter before transmission over the PSTN. This additional companding by the transmitter improves the signal to noise ratio of the combined voice and data signal.

18 Claims, 4 Drawing Sheets

OTHER PUBLICATIONS

"High–Speed Digital and Analog Parallel Transmission Technique Over Single Telephone Channel" by Fumio Akashi, Yoichi Sato and Mikiro Eguchi, IEEE Transactions On Communications, vol. Com. 30, No. 5, May 1982, pp. 1213–1218.

"Simultaneous Transmission of Speech and Data Using Code–Breaking Techniques", by R. Steele and D. Vitello, The Bell System Technical Journal, vol. 60, No. 9, pp. 2081–2105, Nov. 1981, USA.

"Adaptive Noise Cancelling: Principles and Applications" by Bernard Widrow, John R. Glover, Jr., John M. McCool, John Kaunitz, Charles S. Williams, Robert H. Hearn, James R. Zeidler, Eugene Dong, Jr., and Robert C. Goodlin, Proceedings of the IEEE, vol. 63, No. 12, Dec.

"An Integrated Digital Subscribers Speech and Data Service" by L. J. Stagg and D. Clothier, GEC Hirst Research Centre, Wembley, Middlesex, England and GEC Telecommunications Ltd., Conventry, England, pp. 39.6.1–39.6.6, London.

"Frequency Domain Data Transmission Using Reduced Computational Complexity Algorithms", by Abraham Peled and Antonio Ruiz, Computer Sciences Department, IBM T. J. Watson Research Center, IEE 1980, pp. 964–967, USA.

"Speech–band data modems" by P. F. Adams, IEE, 1980, pp. 733–736. USA.

"Speech and Data Transmission In ACS Telephone Channels" by V. E. Bukhviner, Telecommunication & Radio Eng., vol. 30/31, Jul. 1976.

"Method for Superimposing Data On Amplitude–Modulated Signals" Electronics Letters, 29 Apr. 1982, vol. 18, No. 9, pp. 379–381, USA.

"A New Generation of Speech Plus Data Multiplexer", by M. N. Y. Shum, N. A. Samuel and C. Laval, Computer and Systems Engineering Limited (Case), pp. 111–112, London.

COMPANDING OF VOICE SIGNAL FOR SIMULTANEOUS VOICE AND DATA TRANSMISSION

BACKGROUND OF THE INVENTION

The present invention relates to data communications equipment, e.g., modems. In particular, this invention relates to the transmission of both voice and data signals over the same communications facility at the same time.

While voice signals; have a large dynamic amplitude range, they have an amplitude probability distribution heavily weighted toward zero, i.e., voice is mostly very small in amplitude with only occasional bursts to near full scale. To improve performance, telecommunications networks, e.g., the public switched telephone network (PSTN), employ companders to amplify weak voice signals in relation to the large voice signals. This improves the signal to noise ratio (SNR) by raising the average voice signal level above the noise floor of the communications network.

The co-pending, commonly assigned, U.S. Patent application of Gordon Bremer et al. entitled "Simultaneous Analog and Digital Communication," Ser. No. 08/076,505, filed on Jun. 14, 1993, discloses a simultaneous voice and data communication system in which voice signals are added to two-dimensional Quadrature Amplitude Modulated (QAM) data symbols for transmission over a communications channel, e.g., the PSTN, to a receiving modem. In particular, each data symbol is a reference signal point value to which is added a voice signal vector, which represents a voice signal. The addition of the voice signal vector to the data symbol results in a signal point being selected that is a function of both the selected data symbol and the size of the voice signal vector. Unfortunately, since the voice signal is effectively added to the data signal, the voice signal is biased with a different offset for each selected data symbol. The PSTN does not expect a voice signal with, what is effectively, a DC offset. Consequently, this results in low-level voice signals getting no gain from PSTN compandors—which, overall, degrades the quality of the voice transmission through the PSTN.

SUMMARY OF THE INVENTION

Therefore and in accordance with the invention, the voice signal, or analog signal, is companded before application to the PSTN. As a result, low-level voice signals are amplified and the quality of voice transmission does not degrade.

In an embodiment of the invention, a representation of the voice signal is first expanded before it is encoded into a sequence of signal points, where each signal point is selected from a two-dimensional signal space and represents a voice signal vector.

In another embodiment of the invention, the expansion occurs after the voice signal is encoded into a sequence of two-dimensional signal points, where each signal point is selected from a two-dimensional signal space and represents a voice signal vector. In other words, each voice signal vector is expanded before addition to a data symbol.

In another embodiment of the invention, the resultant signal point selected for transmission is expanded. In particular, a voice signal is encoded into a sequence of two-dimensional signal points, where each signal point is selected from a two-dimensional signal space and represents a voice signal vector. Concurrently, a data signal is encoded into a sequence of two-dimensional symbols, where each symbol is represented by a signal point from the two-dimensional signal space. Each voice signal vector is subsequently added to a respective one of the sequence of two-dimensional symbols representing the data signal to select a resultant signal point. Each resultant signal point is altered in accordance with an expansion algorithm before modulation for transmission through the PSTN.

In each of the above embodiments, a receiver performs the corresponding inverse compression of the received signal.

DETAILED DESCRIPTION

The above-mentioned co-pending patent application Bramer et al., Ser. No. 08/076,505, which is hereby incorporated by reference, discloses a transmitter in which the transmitted signal represents a sequence of N-dimensional signal points, where each signal point is a function of at least two separate signals. Illustratively, one of these signals is an audio, or voice signal, and the other signal is a data signal. As noted above, voice signals have a much larger dynamic amplitude range and have an amplitude probability distribution heavily weighted toward zero, i.e., voice is mostly very small in amplitude with only occasional bursts to near full scale.

Figure 1:
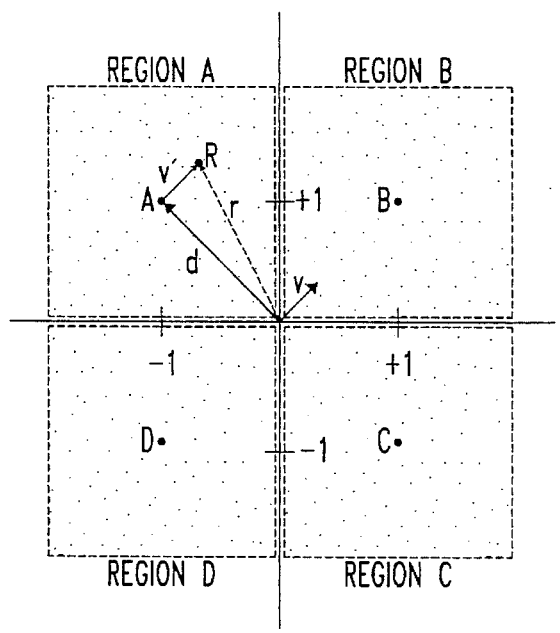
FIG. 1 shows an illustrative signal point constellation for use in a simultaneous voice and data communications system.

An illustrative 4-QAM symbol constellation for use in the simultaneous voice and data system disclosed in the above-mentioned co-pending patent application is shown in FIG. 1. As described in this co-pending patent application, a data signal is first encoded in each signaling interval, T, to select one of four regions, each region represented by one of the reference symbols "A," "B," "C," and "D." For example, the symbol "A" represents region 1, and in particular is associated with the signal point represented by the signal space coordinates (−1, +1), which represents the "in-phase" and "quadrature" components as is known in the art. In a prior art data-only communications system, a transmitter only transmits one of the four symbols selected from this symbol constellation. In other words, there are only four valid signal point coordinates that can be transmitted. However, as disclosed in the co-pending application of Gordon Bremer and Kenneth D. Ko, an analog signal, e.g., a voice signal, is added to the selected data symbol, with the result that any signal point within a chosen region is selected for transmission. Each valid region is associated with a different data symbol. For example, in every signaling interval, T, the voice signal is processed in such a way to provide two samples of the voice signal. These two samples are used to create a "voice signal vector" in the constellation signal space, e.g., the voice signal vector v shown in FIG. 1. In other words, the two samples of the voice signal, every signaling interval, select a signal point about the origin of the signal point constellation. The coordinates of this signal point define the magnitude and angle of the voice signal vector v from the origin of the signal point constellation. This voice signal vector is than added, i.e., by vector addition, to a data vector, d, which represents the selected data symbol in each signaling interval, T. The resultant vector, r, selects a particular signal point, R, for transmission from the selected region. Unfortunately, as illustrated in FIG. 1, the vector addition of the voice signal vector v to the data vector d, results in providing an offset to any voice signals. As such, companders within the PSTN network do not expect to received voice signals with what is effectively a DC offset. Consequently, this results in low-level voice signals getting no gain from PSTN compandors—which, overall, degrades the quality of the voice transmission through the PSTN.

Figure 2:
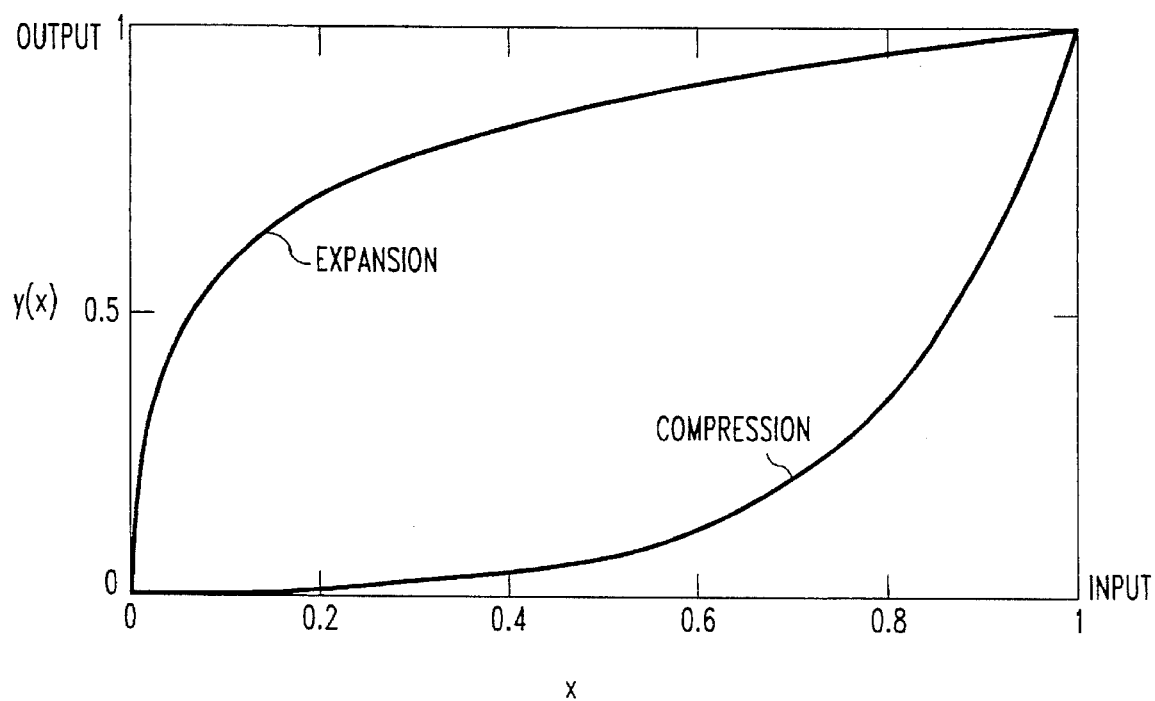
FIG. 2 shows an illustrative µ-law expansion/compression function.

Therefore, in accordance with the principles of the invention, the voice signal is expanded before transmission through the PSTN to improve the signal to noise ratio of the communications system. The expansion is performed in such a way that small amplitude levels of the voice signal are increased relative to the largest amplitude levels of the voice signal. An illustrative prior art Ix-law expansion function is shown in FIG. 2. Also shown in FIG. 2 is the compression function, which is used in a receiver (discussed below) to reverse the expansion process. In particular, for expansion the formula is:

$$y(x) = \frac{\ln(1 + \mu \cdot x)}{\ln(1 + \mu)}, \quad (1)$$

where, x represents the signal being expanded. Conversely, for compression the formula is:

$$y(x) = \frac{(e^{x \cdot \ln(1+\mu)} - 1)}{\mu}, \quad (2)$$

where x represents the signal being compressed. In both cases, μ is a constant value greater than zero. In typical network compandors, μ=255, but for the purpose of this invention any value of μ may be used.

Figure 3:
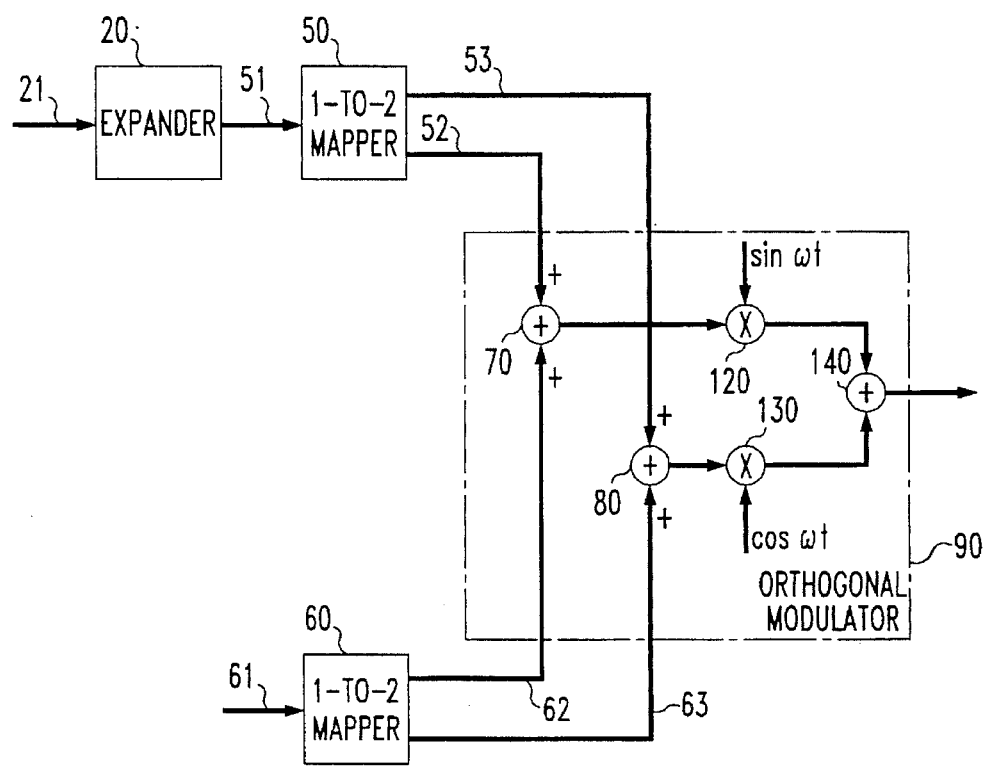
FIG. 3 shows a block diagram of a transmitter embodying the principles of the invention.

An embodiment of the invention is shown in FIG. 3. It includes an expander that expands a voice signal, which is applied via line 21. Expander 20 illustratively functions as shown in FIG. 2 and in accordance with equation (1) (above), and provides an analog output signal to 1-to-2 mapper 50. The latter responds and develops two analog signals on lines 52 and 53, which are applied to adders 70 and 80, respectively. The two analog signals on lines 52 and 53 represent samples of the voice signal and also provide the signal point coordinates for the voice signal vector in every signaling interval, T. Mapper 50 scales the magnitude of the voice signal vector so that the subsequent addition of the voice signal vector to a data symbol (described below) provides a resultant signal point, r, within one of the four square regions of signal points, which is shown in FIG. 1.

In each signalling interval T, encoded digital signals are applied to 1-to-2 dimensional mapper 60, which develops two output pulses on lines 62 and 63, each of which possesses an amplitude that relates to the encoded digital signals arriving on line 61. Outputs 52 and 62 are combined in adder 70 and outputs 53 and 63 are combined in adder 80. The outputs of adders 70 and 80 form the components of the signals that are represented by the signal space of FIG. 1, i.e., the resultant signal points, r. The outputs of adders 70 and 80 are applied to modulators 120 and 130 and summed in adder 140 to form a modulated signal as is typically known in the art. Although not shown for simplicity, it should be noted that the outputs of adders 70 and 80 can be additionally processed by filters that are bandlimited to no more than ω, in order to avoid aliasing, and to at least half the inverse of the output sample rate of mapper 60.

In FIG. 3 element 60 is depicted as a 1-to-2 mapper. However, it should be understood that this element can be an M-to-N mapper. That is, element 60 can be responsive to a plurality (M) of encoded digital signals and it can develop a different plurality (N) of output signals. Similarly, element 50 can be an M-to-K encoder that is responsive to a plurality of analog signals. Likewise, the collection of elements that follow elements 50 and 60 (i.e., elements 70, 80, 120, 130 and 140), which form orthogonal modulator 90 can be constructed to be responsive to the plurality of outputs of elements 50 and 60. More specifically, those elements must account for all of the applied input signals, and that means that they must be able to handle K or N signals, whichever is larger. In such a circumstance, however, the user can assume that the larger of the two (K or N) is the dimensionality of the system, and some of the dimensions have either no digital data, or no analog data, whichever applies. Of course, if there are "dimensions" for which there is no digital or analog data, other information can be sent over those dimensions, such as equalization "side" information.

In the context of a signal space, the N pluralities of output signals of elements 50 and 60 (assuming N is larger than K) correspond to the collection of components of vectors in multi-dimensional space; e.g., N-dimensional space. The coordinates of this multi-dimensional space correspond to the orthogonal modulation signals within orthogonal modulator 90. In FIG. 3, the two orthogonal modulation signals are cos ωt and sin ωt, but other modulation signals are also possible. For example, code division multiplexing (CDMA) templates. For purposes of this invention, orthogonal modulation signals are modulation signals that develop a transmitted signal comprising concurrent element signals and yet allow the receiver to separate the received signal into its constituent element signals, those being the signals developed in response to each of the modulation signals. It may also be observed that, relative to FIG. 1 as discussed above, orthogonal modulator 90 performs vector summation of the symbol vector represented by the components developed by element 60 with the analog information vector represented by the components developed by element 50.

Figure 4:
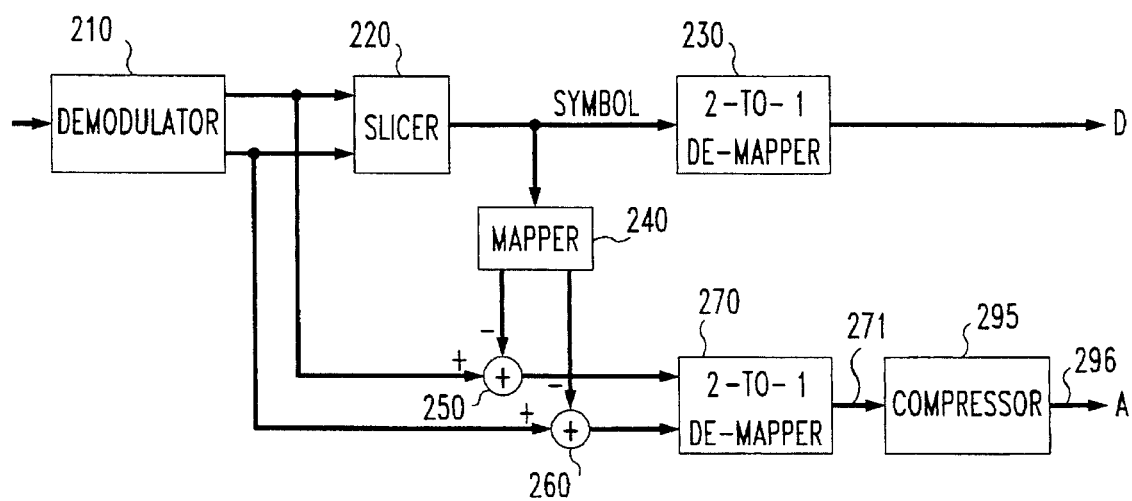
FIG. 4 shows a block diagram of a receiver embodying the principles of the invention for receiving a signal from the transmitter of FIG. 3.

FIG. 4 presents a basic block diagram of a receiver in conformance with the principles of this invention. The modulated input signal received from the channel is applied to demodulator 210 which develops the in-phase and quadrature components. Those are applied to slicer 220 which identifies the symbols, i.e., maps the received signal point to the closest data symbol from the constellation of FIG. 1. Slicer 220 provides the identified symbols to de-mapper 230, which performs the inverse function to mapper 60 discussed above. In addition, FIG. 4 includes 1-to-2 mapper 240 that is responsive to the symbols developed by channel slicer 220. The output of mapper 240 is the set of in-phase and quadrature components (that are applied in the FIG. 3 arrangement to elements 70 and 80). The outputs of mapper 240 are subtracted from the outputs of demodulator 210 in subtractors 250 and 260. The outputs of subtractors 250 and 260 are applied to 2-to-1 de-mapper 270 which recombines the analog samples to form an expanded analog signal. De-mapper 270 performs the inverse function of mapper 50. This expanded analog signal is applied to compressor 95, which performs the inverse function of expander 20 discussed above, e.g., equation (2). Compressor 95 provides the recovered voice signal on line 296.

Figure 5:
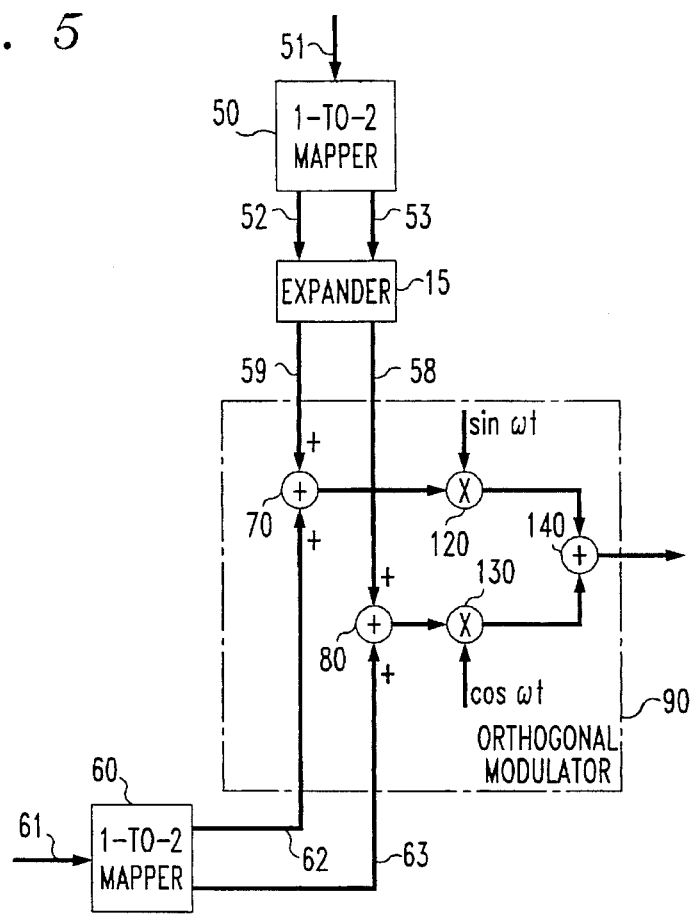
FIG. 5 shows a block diagram of another transmitter embodying the principles of the invention.
Figure 6:
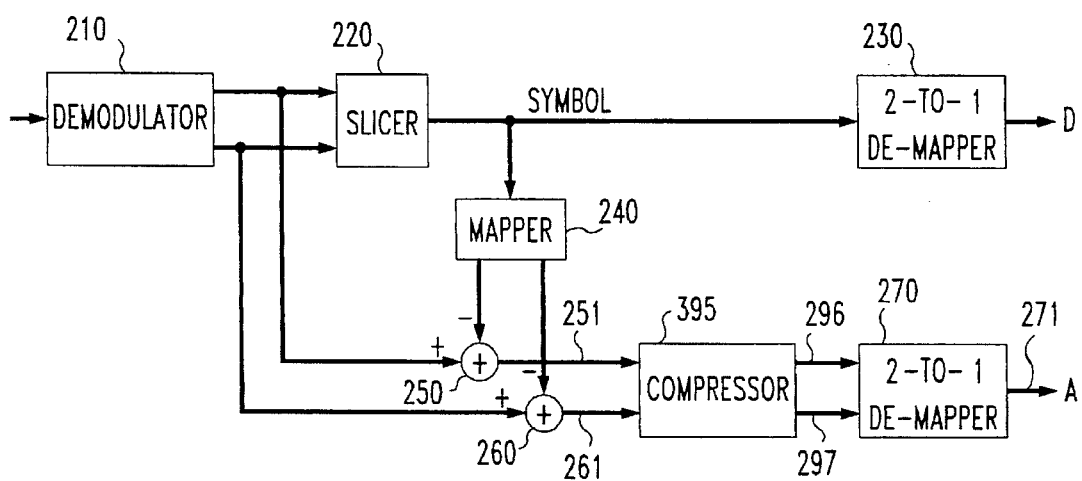
FIG. 6 shows a block diagram of a receiver embodying the principles of the invention for receiving a signal from the transmitter of FIG. 5.

Another embodiment of the invention is shown in FIG. 5. The only difference between FIG. 5 and the first embodiment of the invention discussed above is that the expansion is performed after mapping a voice signal to the constellation signal space. In particular, the voice signal is applied to 1-to-2 mapper 50. The latter responds and develops two analog signals on lines 52 and 53, which are applied to expander 15. The latter, as described above and shown in FIG. 2, expands the low level analog signals more than the higher level analog signals. Expander 15 provides output signals on lines 58 and 59 to the remaining elements of FIG. 5, which function as described above in the embodiment of FIG. 3. Similarly, FIG. 6 presents a basic block diagram of a receiver in conformance with the principles of this invention. The receiver of FIG. 6 functions similarly to the receiver of FIG. 4 except that compressor 395 receives the output signals from adders 250 and 260, and provides output signals on lines 296 and 297 to 2-to-1 de-mapper 270, which recombines the analog samples to form the analog signal. De-mapper 270 performs the inverse function of mapper 50.

Figure 7:
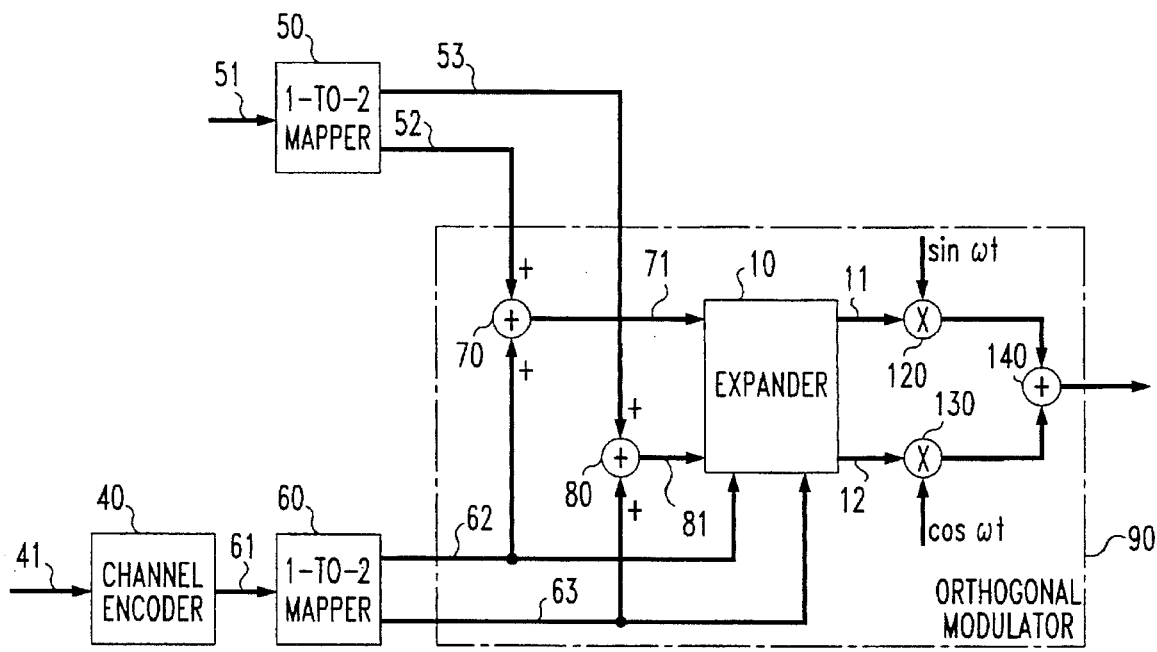
FIG. 7 shows a block diagram of another transmitter embodying the principles of the invention.

Another embodiment of the invention is shown in FIG. 7. Here, the expansion occurs after selection of the resultant signal point for modulation. The analog signal is applied to 1-to-2 mapper 50. The latter responds and develops two analog signals on lines 52 and 53, which are applied to adders 70 and 80, respectively. The two analog signals on lines 52 and 53 represent the signal point coordinates for the analog signal vector in every signaling interval, T. Mapper 50 bounds the magnitude of the voice signal vector so that the subsequent addition of the analog signal vector to a data symbol provides a resultant signal point, r, within one of the four regions of signal points, which is shown in FIG. 1.

In each signalling interval T, encoded digital signals are applied to 1-to- 2dimensional mapper 60, which develops two output pulses on lines 62 and 63, each of which possesses an amplitude that relates to the encoded digital signals arriving on line 61, which are provided by channel encoder 40. The latter develops the encoded digital signals, from applied data signal 41, as is known in the art. Outputs 52 and 62 are combined in adder 70 and outputs 53 and 63 are combined in adder 80. The outputs of adders 70 and 80 form the components of the signals that are represented by the signal space of FIG. 1. The outputs of adders 70 and 80 are applied to expander 10. The latter, as described above and shown in FIG. 2, expands the low level analog signals more than the higher level analog signals. Expander 10 provides output signals on lines 11 and 12 to modulators 120 and 130, the output signals of which are: summed in adder 140 to form a modulated signal as is typically known in the art. In the context of this example, the expansion of the resultant signal point is taken with respect to the reference point of the selected region. As a result, output signals on lines 62 and 63 are applied to expander 10. For example, if region A, of FIG. 1, is selected, the coordinates of the data symbol A provide the reference coordinates for the expansion of the resultant signal point.

Figure 8:
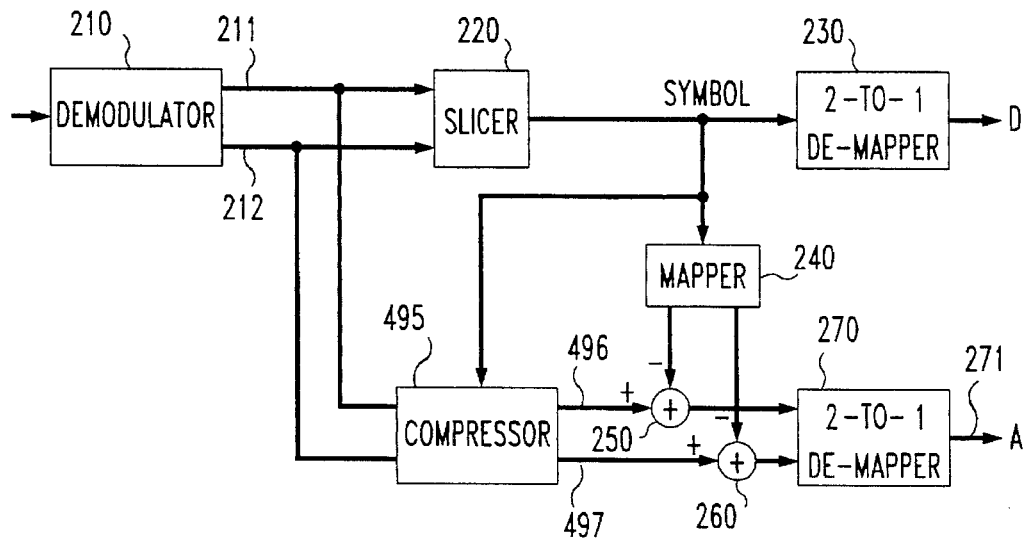
FIG. 8 shows a block diagram of a receiver embodying the principles of the invention for receMng a signal from the transmitter of FIG. 7.

FIG. 8 presents a basic block diagram of a receiver in conformance with the principles of this invention. The modulated input signal received from the channel is applied to alemodulator 210 which develops the in-phase and quadrature components that are applied to both compressor 495 and slicer 220. The latter identifies the symbols, i.e., maps each one of the received signal points to the closest data symbol from the constellation of FIG. 1. Slicer 220 provides the identified symbols to de-mapper 230, which performs the inverse function to mapper 60 discussed above. In addition, slicer 220 provides the identified symbols to both 1-to-2 mapper 240 and compressor 495. The latter performs the inverse function of expander 10 discussed above as a function of both a selected compression algorithm and a respective one of the identified symbols in each signaling interval, T. Compressor 495 provides output signals on lines 496 and 497. The output signals of mapper 240 are the set of in-phase and quadrature components (that are applied in the FIG. 7 arrangement to elements 70 and 80). The outputs of mapper 240 are subtracted from the outputs of compressor 495 in subtractors 250 and 260. The outputs of subtractors 250 and 260 are applied to 2-to-1 de-mapper 270 which recombines the analog samples to form the analog signal. De-mapper 270 performs the inverse function of mapper 50.

The foregoing merely illustrates the principles of the invention and it will thus be appreciated that those skilled in the art will be able to devise numerous alternative arrangements which, although not explicitly described herein, embody the principles of the invention and are within its spirit and scope.

For example, although each of the above illustrative embodiments are basic illustrations of the inventive concept, it is readily apparent that the inventive concept is easily applied to more sophisticated designs of data communications equipment. As illustration, the transmitter embodiment of HG. 3 can be modified to include an error correcting technique like a trellis code, or other forms of modulation besides QAM.

In addition, although the invention is illustrated herein as being implemented with discrete functional building blocks, e.g., expander 30, etc., the functions of any one or more of those building blocks can be carried out using one or more appropriate programmed processors.

In addition, although this invention is illustrated herein as being implemented using a μ-law companding algorithm, other algorithms may be implemented instead, e.g., A-law, or a piecewise linear or other approximation of either μ-law or A-law, or a sine function, or any other companding technique available to those skilled in the art.

We claim:

1. A method for conditioning a signal for transmission, comprising the steps of:

receiving in a modem a first applied signal and a data signal;

expanding the first applied signal to provide an expanded first signal, where the expanding is performed to increase the size of small amplitude levels of the first applied signal relative to large amplitude levels of the first applied signal; and processing the expanded first signal and the data signal to provide a resultant signal for transmission from the modem, where the resultant signal represents a sequence of N-dimensional signal points for transmission, where each one of the N-dimensional signal points is selected as a function of the expanded first signal and the data signal such that each N-dimensional signal points in a region of a signal space that is dictated by the data signal and is at a point in that region that is dictated by the expanded first signal.

2. A method for transmitting comprising the steps of:

receiving in a modem an applied first signal and a data signal;

encoding the applied first signal to provide a plurality of signal vectors, where each signal vector of the plurality is defined by the coordinates of an N-dimensional signal point taken from a signal space;

expanding the magnitude of each one of the plurality of signal vectors to provide a plurality of expanded signal vectors, where the expanding is performed to increase the size of small magnitudes of the signal vector relative to large magnitudes of the signal vector; and encoding the data signal to provide a plurality of data symbols, each data symbol represented by an N-dimensional signal point from the signal space;

adding each one of the plurality of expanded signal vectors to a respective one of the plurality of data symbols to provide a sequence of resultant signal points; and transmitting from the modem signal that represents the sequence of resultant signal points.

3. The method of claim 2 wherein the applied first signal is a voice signal.

4. The method of claim 2 wherein each resultant signal point is in a region of a signal space that is dictated by the data signal and is at a point in that region that is dictated by the respective expanded signal vector.

5. A method for transmitting comprising the steps of:

receiving in a modem an applied first signal and a data signal;

encoding the applied first signal to provide a plurality of first signal vectors, where each first signal vector is defined by the coordinates of an N-dimensional signal point taken from a signal space;

encoding the data signal to provide a plurality of data symbols, each data symbol represented by an N-dimensional signal point from the constellation of signal points;

adding each one of the plurality of first signal vectors to a respective one of the plurality of data symbols to provide a sequence of resultant N-dimensional signal points;

altering each one of the resultant signal points of said sequence in accordance with an expansion formula and the respective one of the plurality of data symbols wherein the expansion formula increases the size of small magnitudes of first signal vectors relative to large magnitudes of first signal vectors; and transmitting from the modem a resultant signal that represents the sequence of altered resultant signal points.

6. The method of claim 5 wherein the applied first signal is a voice signal.

7. The method of claim 5 wherein each resultant signal point is in a region of a signal space that is dictated by the data signal and is at a point in that region that is dictated by the respective first signal vector.

8. A method for receiving comprising the steps of:

receiving in a modem a signal that represents a sequence of N-dimensional signal points;

processing in the modem the received sequence of signal points to provide a first signal and a data signal, where the first signal represents an expanded form of a voice signal; and compressing in the modem the first signal to provide the voice signal, where the compressing is performed to decrease small amplitude levels relative to large amplitude levels of the first signal.

9. A method for receiving comprising the steps of:

receiving in a modem a signal that represents a sequence of N-dimensional signal points:

recovering from the sequence of N-dimensional signal points a sequence of data symbols, where each data symbol is selected from a signal space;

subtracting in the modem each one of the data symbols from a respective one of the sequence of N-dimensional signal points to provide a corresponding sequence of signal points, where each signal point of the corresponding sequence defines a signal vector;

compressing in the modem the sequence of signal vectors to provide a sequence of compressed signal vectors, where the compression is performed to decrease small magnitudes relative to large magnitudes; and recovering from the sequence of compressed signal vectors a voice signal.

10. Data communications equipment apparatus comprising:

means for receiving a first applied signal and a data signal, means for expanding the first applied signal to provide an expanded first signal, where the expanding is performed to increase the size of small amplitude levels of the first applied signal relative to large amplitude levels of the first applied signal, and means for processing the expanded first signal and the data signal to provide a resultant signal for transmission from the data communications apparatus, where the resultant signal represents a sequence of N-dimensional signal points for transmission, where each one of the N-dimensional signal points is selected as a function of the expanded first signal and the data signal such that each N-dimensional signal point is in a region of a signal space that is dictated by the data signal and is at a point in that region that is dictated by the expanded first signal.

11. Data communications equipment apparatus comprising:

means for receiving an applied first signal and a data signal, means for encoding the applied first signal to provide a plurality of signal vectors, where each signal vector of the plurality is defined by the coordinates of an N-dimensional signal point taken from a signal space;

means for expanding the magnitude of each one of the plurality of signal vectors to provide a plurality of expanded signal vectors, where the expanding is performed to increase the size of small magnitudes of the signal vector relative to large magnitudes of the signal vector; and means for encoding the data signal to provide a plurality of data symbols, each data symbol represented by an N-dimensional signal point from the signal space;

means for adding each one of the plurality of expanded signal vectors to a respective one of the plurality of data symbols to provide a sequence of resultant signal points; and means for transmitting a signal that represents the sequence of resultant signal points.

12. The apparatus of claim 11 wherein the applied first signal is a voice signal.

13. The apparatus of claim 11 wherein each resultant signal point is in a region of a signal space that is dictated by the data signal and is at a point in that region that is dictated by the respective expanded first signal vector.

14. Data communications equipment apparatus comprising:

means for receiving an applied first signal and a data signal, means for encoding the applied first signal to provide a plurality of first signal vectors, where each first signal vector is defined by the coordinates of an N-dimensional signal point taken from a signal space;

means for encoding the data signal to provide a plurality of data symbols, each data symbol represented by an N-dimensional signal point from the constellation of signal points;

means for adding each one of the plurality of first signal vectors to a respective one of the plurality of data symbols to provide a sequence of resultant N-dimensional signal points;

means for altering each one of the resultant signal points of said sequence in accordance with an expansion formula and the respective one of the plurality of data symbols wherein the expansion formula increases the size of small magnitudes of first signal vectors relative to large magnitudes of first signal vectors; and means for transmitting a resultant signal that represents the sequence of altered resultant signal points.

15. The apparatus of claim 14 wherein the applied signal is a voice signal.

16. The apparatus of claim 14 wherein each resultant signal point is in a region of a signal space that is dictated by the data signal and is at a point in that region that is dictated by the respective first signal vector.

17. Data communications equipment apparatus comprising:

means for receiving a signal that represents a sequence of N-dimensional signal points;

means for processing the received sequence of signal points to provide a first and a data signal, where the first signal represents an expanded form of a voice signal; and means for compressing the first signal to provide the voice signal, where the compressing is performed to decrease small amplitude levels relative to large amplitude levels of the first signal.

18. Data communications equipment apparatus comprising;

means for receiving a signal that represents a sequence of N-dimensional signal points;

means for recovering from the sequence of N-dimensional signal points a sequence of data symbols, where each data symbol is selected from a signal space;

means for subtracting each one of the data symbols from a respective one of the sequence of N-dimensional signal points to provide a corresponding sequence of signal points, where each signal point of the corresponding sequence defines a signal vector;

means for compressing the sequence of the signal vectors to provide a sequence of compressed signal vectors, where the compression is performed to decrease small magnitudes relative to large magnitudes; and means for recovering from the sequence of compressed signal vectors a voice signal.

\* \* \* \* \*